(12) United States Patent
Fujii

(10) Patent No.: US 8,102,011 B2
(45) Date of Patent: Jan. 24, 2012

(54) SEMICONDUCTOR DEVICE INCLUDING A FIELD EFFECT TRANSISTOR AND METHOD FOR MANUFACTURING THE SAME

(75) Inventor: Hiroki Fujii, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 113 days.

(21) Appl. No.: 12/585,939

(22) Filed: Sep. 29, 2009

(65) Prior Publication Data

US 2010/0078720 A1 Apr. 1, 2010

(30) Foreign Application Priority Data

Sep. 30, 2008 (JP) ................................. 2008-253343

(51) Int. Cl.
*H01L 29/02* (2006.01)
(52) U.S. Cl. .................. 257/399; 257/E29.02
(58) Field of Classification Search .................. 257/395, 257/396, 399, E21.552, E29.02
See application file for complete search history.

(56) References Cited

U.S. PATENT DOCUMENTS

| | | | |
|---|---|---|---|
| 5,304,827 A * | 4/1994 | Malhi et al. | 257/262 |
| 6,215,138 B1 | 4/2001 | Takao | |
| 6,784,490 B1 * | 8/2004 | Inoue et al. | 257/344 |
| 6,833,586 B2 * | 12/2004 | Tsuchiko | 257/343 |
| 7,268,045 B2 | 9/2007 | Hower et al. | |
| 2009/0032870 A1 * | 2/2009 | Iida | 257/339 |

FOREIGN PATENT DOCUMENTS

| | | |
|---|---|---|
| JP | 11-307763 | 11/1999 |
| JP | 2001-94103 | 4/2001 |
| JP | 2002-237591 | 8/2002 |

* cited by examiner

*Primary Examiner* — Colleen Matthews
(74) *Attorney, Agent, or Firm* — McGinn Intellectual Property Law Group, PLLC

(57) ABSTRACT

There is provided a semiconductor device including a field effect transistor. The field effect transistor includes a p-type low concentration region formed over a surface of a substrate, an n-type drain-side diffusion region and an n-type source-side diffusion region formed over a surface of the p-type low concentration region, an element isolation insulating layer, and another element isolation insulating layer. A p-type high concentration region, which has an impurity concentration higher than the impurity concentration of the p-type low concentration region, is formed below the n-type source-side diffusion region in the p-type low concentration region over a range at least from one end, which is opposite to the other end facing to the channel region, of the source-side diffusion region to one end, which is facing to the channel region, of the second element isolation insulating layer, when seen in a plan view.

17 Claims, 14 Drawing Sheets

1

SEMICONDUCTOR DEVICE INCLUDING A FIELD EFFECT TRANSISTOR AND METHOD FOR MANUFACTURING THE SAME

This application is based on Japanese patent application NO. 2008-253343, the content of which is incorporated hereinto by reference.

BACKGROUND

1. Technical Field

The present invention relates to a semiconductor device and a method for manufacturing the same, and more particularly, to a semiconductor device including a field effect transistor, and a method for manufacturing the same.

2. Related Art

FIG. 13 shows a structure of a Lateral Double-diffused Metal Oxide Semiconductor (LDMOS) disclosed in U.S. Pat. No. 7,268,045 and Japanese Laid-open patent publication NO. 2002-237591. The LDMOS includes a p-type body region 22 formed in a surface of an n-type well 12, an n-type source region 18 formed in the body region 22, and a drain region 16 formed in the surface of the n-type well 12 with an element isolation insulating layer 28 interposed between the body region 22 and the drain region 16. Here, a buried region 30 is formed below the source region 18 in the body region 22.

These patent documents state that the LDMOS has the following problem. When a high voltage is applied, the source region, the body region and the drain region of the LDMOS respectively correspond to an emitter, a base and a collector of a parasitic bipolar transistor, and the parasitic bipolar transistor may be turned on by carriers (holes) created by impact ionization in the drain region of the LDMOS. Once the parasitic bipolar transistor is turned on, continued generation of secondary holes at the drain side will keep the bipolar transistor turned on until the device is destroyed. When a secondary hole current turns on a parasitic NPN device, this device begins to provide a secondary electron current. If the ratio of secondary electrons per secondary hole times the ratio of secondary holes per electron exceeds 1, the secondary electron current and secondary hole current are in a positive feedback relationship, and the device is no longer controlled by the gate.

In addition, the above-mentioned patent documents state that generation of the secondary electrons can be considerably reduced by providing the buried region 30 and providing a low resistance shunt path for the holes that are generated in the drain region due to impact ionization, thereby decreasing the gain of the parasitic PNP bipolar transistor and increasing the safe operating area (SOA).

In addition, among high breakdown voltage MOS transistors, there has been known a so-called LOCOS offset type structure with a thick field oxide layer (hereinafter referred to as LOCOS) formed at an end of a gate electrode or between the gate electrode, a drain diffusion layer and a source diffusion layer (Japanese Laid-open patent publication NO. 2001-94103).

FIG. 14 shows an example of a semiconductor device with such a structure. A semiconductor device 300 includes a p-type lightly-doped substrate 302, an n-type drain-side diffusion region 312 and an n-type source-side diffusion region 314 formed over the substrate 302, a source electrode 320 formed in a surface of the n-type source-side diffusion region 314, a drain electrode 318 formed in a surface of the n-type drain-side diffusion region 312, a gate insulating layer 336 and a gate electrode 338 formed over a region between the n-type drain-side diffusion region 312 and the n-type source-side diffusion region 314 in the surface of the substrate 302. A channel region is formed between the n-type drain-side diffusion region 312 and the n-type source-side diffusion region 314. In addition, an element isolation insulating layer 332 is provided between the channel region and the drain electrode 318 to isolate them from each other. In addition, an element isolation insulating layer 334 is provided between the channel region and the source electrode 320 to isolate them from each other. With this configuration, the p-type low concentration region constituted by the substrate 302 is provided over the entire lower side of the n-type drain-side diffusion region 312 and the n-type source-side diffusion region 314, and is in contact with the n-type drain-side diffusion region 312 and the n-type source-side diffusion region 314.

SUMMARY

However, also in the semiconductor device 300 shown in FIG. 14, the n-type drain-side diffusion region 312, the p-type region constituted by the substrate 302 and the n-type source-side diffusion region respectively correspond to an emitter, a base and a collector of a parasitic bipolar transistor, and when a high voltage is applied, there may be problems such that the parasitic bipolar transistor is turned on by holes created by impact ionization in the n-type drain-side diffusion region 312 as described in the above.

Here, in the LDMOS shown in FIG. 13, since the p-type body region 22 is formed at a position separated from the drain region 16, concentration of the p-type body region 22 can be set without considering the relationship with the drain region 16. On the other hand, in the semiconductor device 300 shown in FIG. 14, unlike the LDMOS, since both the n-type drain-side diffusion region 312 and the n-type source-side diffusion region 314 are in contact with the p-type region constituted by the substrate 302, impurity concentration of the p-type region cannot be freely set. That is, the impurity concentration of the p-type region is required to be set in consideration of the relationship with the n-type drain-side diffusion region 312 and the relationship with the n-type source-side diffusion region 314. For example, if the impurity concentration of the p-type region is made to be high, a breakdown voltage with the n-type drain-side diffusion region 312 at the drain side cannot be kept high. Accordingly, the impurity concentration of the p-type region should be set to be low.

In one embodiment, there is provided a semiconductor device including a substrate and a field effect transistor, wherein the field effect transistor includes:

a channel region with a gate length "L" formed at a surface of the substrate;

a gate electrode formed over the channel region;

a source electrode and a drain electrode formed at both sides of the gate electrode;

a low concentration region of a first conductivity type, which is formed in the surface of the substrate;

a drain-side diffusion region of a second conductivity type, which is formed in a surface of the low concentration region of the first conductivity type, the drain electrode being formed over a portion of a surface of the drain-side diffusion region;

a source-side diffusion region of the second conductivity type, which is formed in a surface of the low concentration region of the first conductivity type, the channel region being formed between the drain-side diffusion region and the source-side diffusion region, the source electrode being formed over a portion of a surface of the source-side diffusion region;

a first element isolation insulating layer which is formed over the drain-side diffusion region of the second conductivity type, isolates the drain-side diffusion region at the surface of the substrate and isolates the channel region from the drain electrode; and a second element isolation insulating layer which is formed over the source-side diffusion region of the second conductivity type, isolates the source-side diffusion region at the surface of the substrate and isolates the channel region from the source electrode, and wherein a high concentration region of the first conductivity type, which has an impurity concentration higher than the impurity concentration of the low concentration region, is formed below the source-side diffusion region in the low concentration region of the first conductivity type over a range at least from one end, which is opposite to the other end facing to the channel region, of the source-side diffusion region to one end, which is facing to the channel region, of the second element isolation insulating layer, when seen in a plan view.

In another embodiment, there is provided a method of manufacturing a semiconductor device including a substrate and a field effect transistor including a channel region with a gate length "L" formed at a surface of the substrate, a gate electrode formed over the channel region, and a source electrode and a drain electrode formed at both sides of the gate electrode, including:

forming a first element isolation insulating layer and a second element isolation insulating layer separated from each other over a surface of a low concentration region of a first conductivity type formed in a surface of the substrate;

forming a drain-side diffusion region of a second conductivity type, which is isolated by the first element isolation insulating layer, and a source-side diffusion region of the second conductivity type, which is isolated by the second element isolation insulating layer, in the surface of the low concentration region of the first conductivity type, the channel region being formed between the drain-side diffusion region and the source-side diffusion region;

forming a high concentration region of the first conductivity type, which has an impurity concentration higher than that of the low concentration region, below the source-side diffusion region in the low concentration region of the first conductivity type;

forming the drain electrode over a surface of the drain-side diffusion region at a side isolated from the channel region by the first element isolation insulating layer; and forming the source electrode over a surface of the source-side diffusion region at a side isolated from the channel region by the second element isolation insulating layer, wherein the high concentration region of the first conductivity type is formed over a range at least from one end, which is opposite to the other end facing to the channel region, of the source-side diffusion region to one end, which is facing to the channel region, of the second element isolation insulating layer, when seen in a plan view.

The present inventor has found that the semiconductor device 300 shown in FIG. 14 has a problem in that the base resistance of the base of the parasitic bipolar transistor increases and the parasitic bipolar transistor is apt to turn on as the concentration of the p-type region cannot be made to be high, and has made the present invention for the purpose of overcoming such a problem. By forming the high concentration region of the first conductivity type below the source-side diffusion region, it is possible to decrease the base resistance and to obtain the effect of a large ON breakdown voltage.

Here, the substrate may be either a semiconductor wafer alone or a semiconductor wafer on which a semiconductor layer such as an epitaxial layer is formed.

In addition, any combinations of the above-mentioned components and changes of the representations of the methods and devices of the present invention are also effective as aspects of the present inventions.

According to the present invention, it is possible to keep a high ON breakdown voltage in semiconductor devices including field effect transistors.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
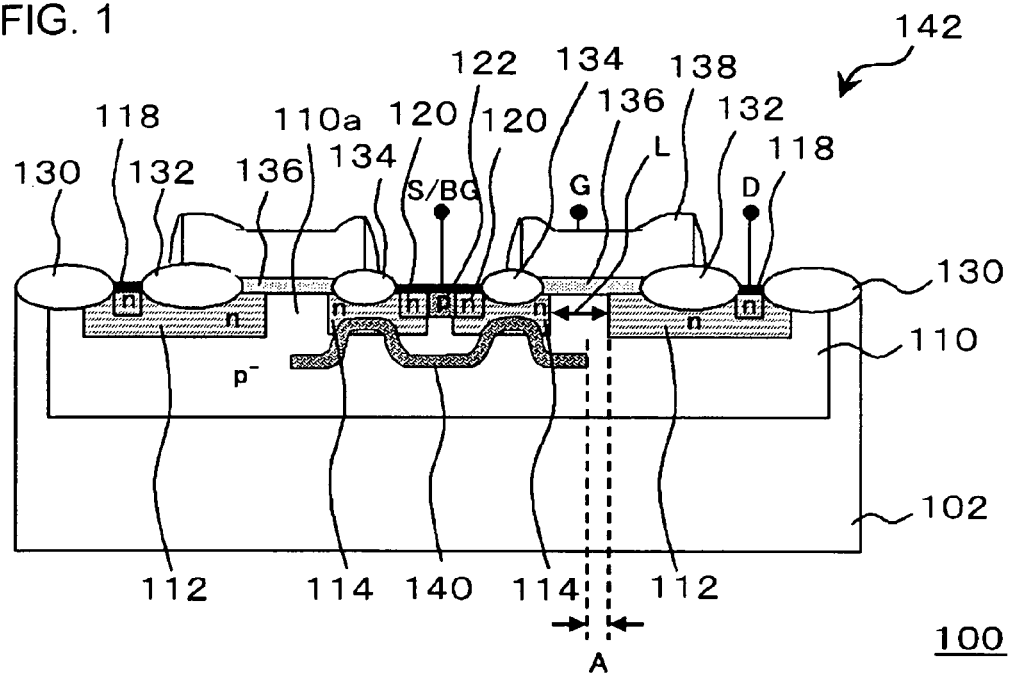
FIG. 1 is a sectional view showing a configuration of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the present invention will be described with reference to the accompanying drawings. Throughout the drawings, like elements are denoted by like reference numerals and explanation of which will not be repeated.

First Embodiment

Figure 2:
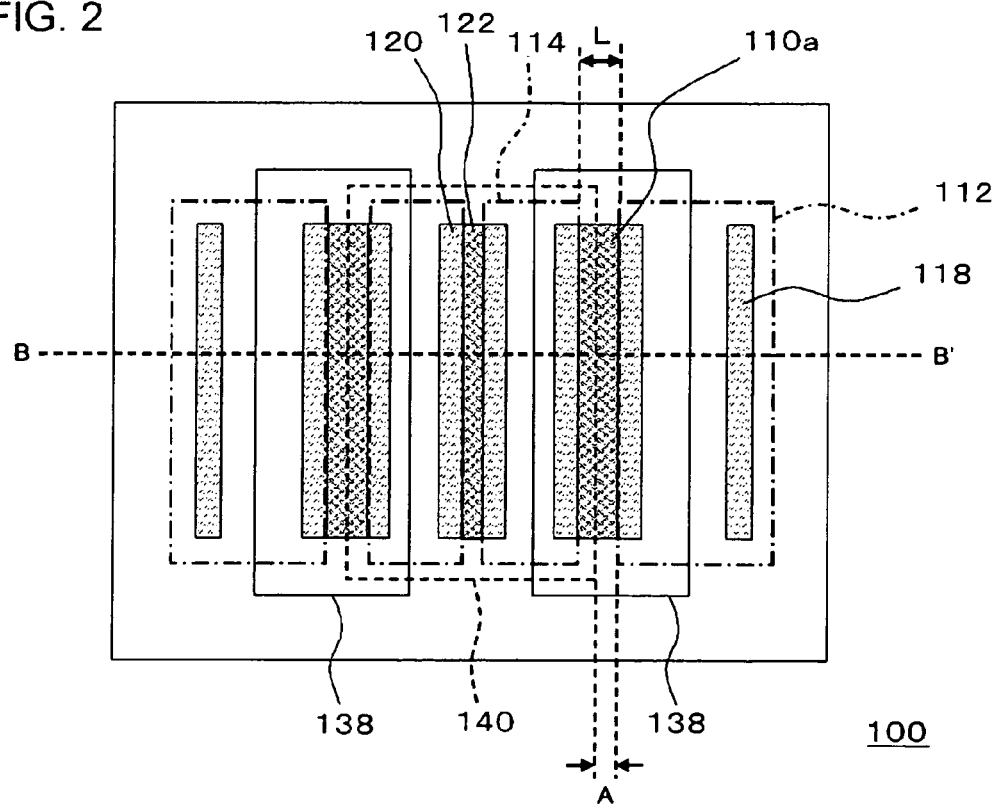
FIG. 2 is a plan view showing a configuration of the semiconductor device according to an embodiment of the present invention.

FIG. 1 is a sectional view showing a configuration of a semiconductor device according to an embodiment of the present invention. FIG. 2 is a plan view showing a configuration of the semiconductor device shown in FIG. 1. FIG. 1 corresponds to a sectional view taken along line B-B' of FIG. 2.

In this embodiment, a semiconductor device 100 includes a semiconductor substrate 102 (substrate), and a high breakdown voltage MOS transistor 142 (field effect transistor) formed over the semiconductor substrate 102.

In this embodiment, the high breakdown voltage MOS transistor 142 includes a channel region 110a with a gate length L which is formed at a surface of the semiconductor substrate 102, a gate insulating layer 136 and a gate electrode 138 formed over the channel region 110a, and a source electrode 120 and a drain electrode 118 formed at both sides of the gate electrode 138.

The high breakdown voltage MOS transistor 142 further includes a p-type (first conductivity type) low concentration region 110 formed at the surface of the semiconductor substrate 102, an n-type (second conductivity type) drain-side diffusion region 112 formed at a surface of the p-type low concentration region 110, with the drain electrode 118 formed on a portion of the surface thereof, and an n-type source-side diffusion region 114 formed at a surface of the p-type low concentration region 110, with the source electrode 120 formed on a portion of the surface thereof so that the channel region 110a is interposed between the n-type drain-side diffusion region 112 and the n-type source-side diffusion region 114. That is, in this embodiment, the channel region 110a is constituted by the p-type low concentration region 110. The high breakdown voltage MOS transistor 142 further includes an element isolation insulating layer 132 (first element isolation insulating layer) which is formed over the n-type drain-side diffusion region 112 to isolate the channel region 110a from the drain electrode 118 at the surface of the semiconductor substrate 102, and an element isolation insulating layer 134 (second element isolation insulating layer) which is formed over the n-type source-side diffusion region 114 to isolate the channel region 110a from the source electrode 120 at the surface of the semiconductor substrate 102. The semiconductor device 100 further includes a p-type high concentration region 140 which is formed below the n-type source-side diffusion region 114 in the p-type low concentration region 110 and has an impurity concentration higher than that of the p-type low concentration region 110. The impurity concentration in the p-type low concentration region 110 may be set to, for example, $1 \times 10^{16}$ cm$^{-3}$. The impurity concentration in the p-type high concentration region 140 may be set to, for example, $1 \times 10^{18}$ cm$^{-3}$.

In addition, in this embodiment, the high breakdown voltage MOS transistor 142 further includes a back gate electrode 122 provided adjacent to the source electrode 120. In this embodiment, the source electrode 120 and the back gate electrode 122 may be configured so as to be circuit-shorted over a diffusion layer. This configuration can decrease the base resistance of a parasitic bipolar transistor, thereby increasing an ON breakdown voltage. In this embodiment, the semiconductor device 100 is formed in bilateral symmetry with respect to the back gate electrode 122. In addition, an element isolation insulating layer 130 is formed in an outer side of the drain electrode 118.

In this embodiment, the p-type high concentration region 140 may be formed by implanting impurity ions over the element isolation insulating layer 134 after forming the element isolation insulating layer 134. In this embodiment, accordingly, the p-type high concentration region 140 is formed at a shallow position closer to the surface of the semiconductor substrate 102 below the element isolation insulating layer 134 than other regions such as below the back gate electrode 122, the source electrode 120 and the gate insulating layer 136.

Figure 13:
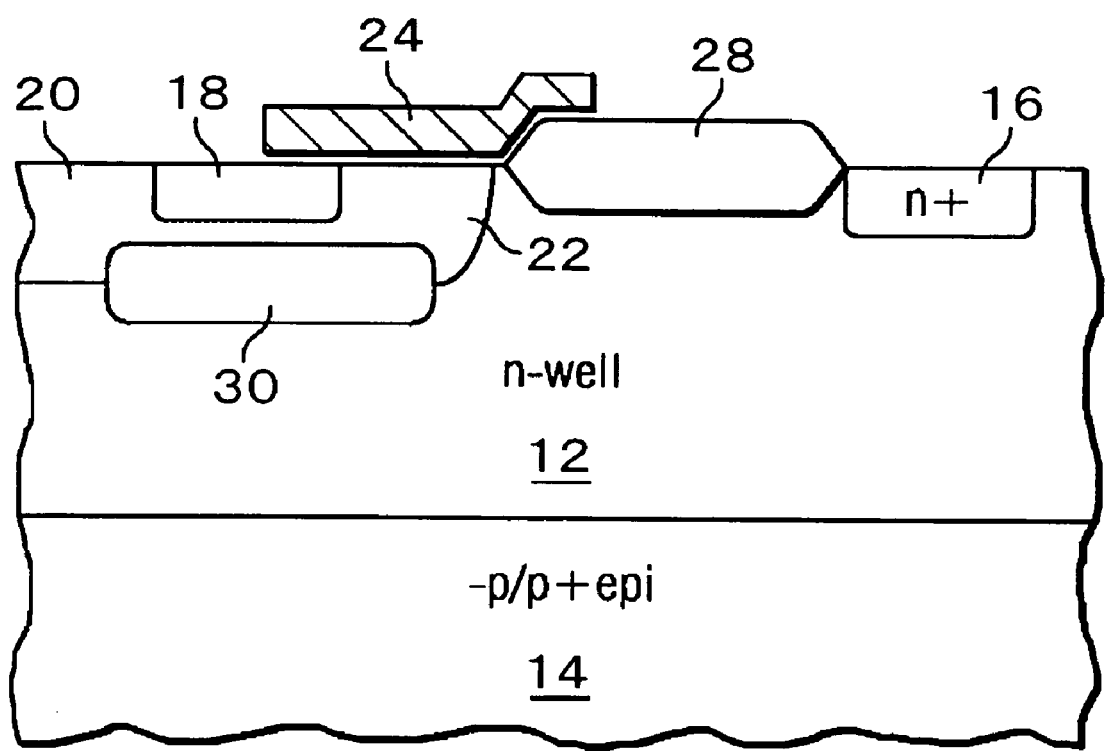
FIG. 13 is a view showing a conventional LDMOS structure.
Figure 14:
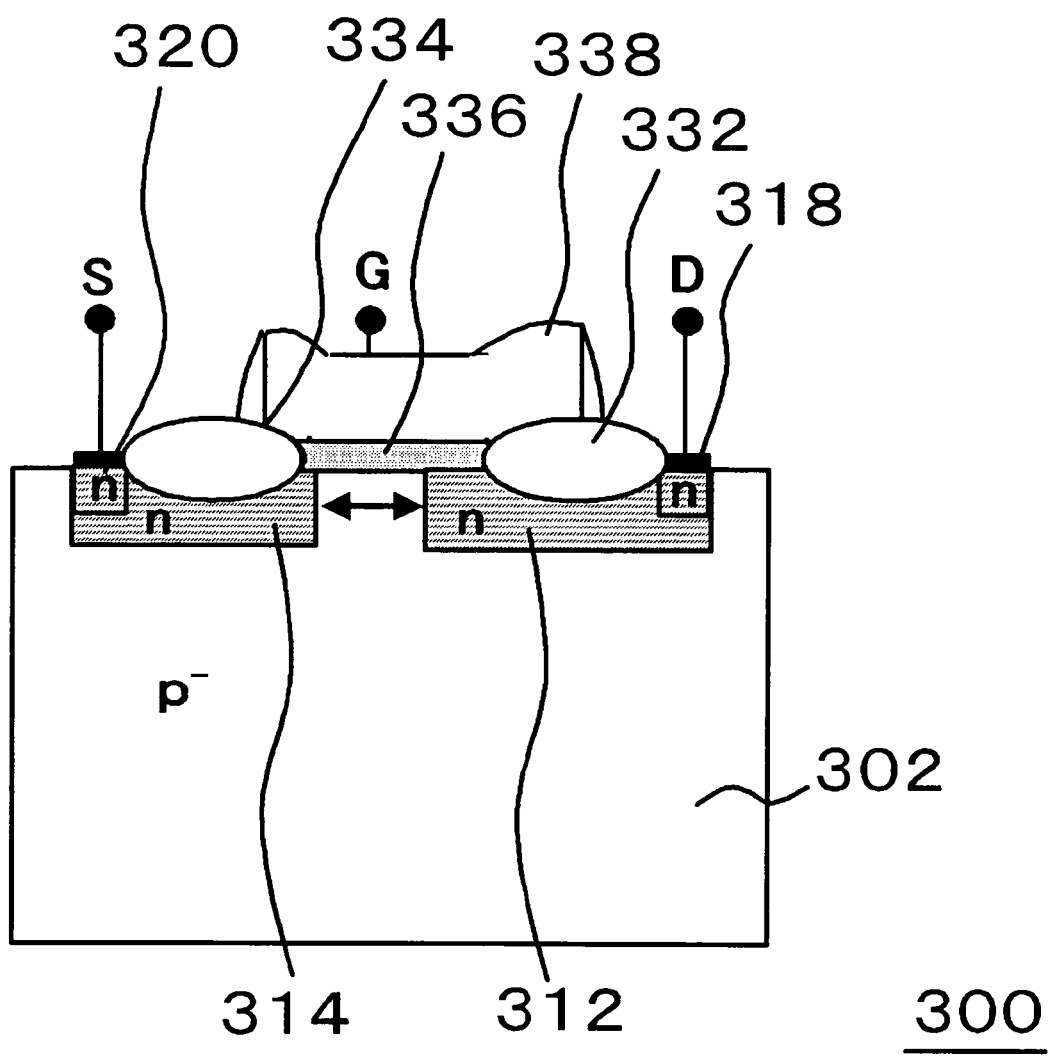
FIG. 14 is a view showing a configuration of an LOCOS offset type semiconductor device.

In the LDMOS shown in FIG. 13, when the buried region 30 is formed, a tail portion of impurities in the buried region 30 may remain on a surface of a body region 22, which may result in significant increases in the VT value of the MOS transistor and the variation in this value. In order to avoid this problem, if the buried region 30 is formed at a deep position, the distance between a well electrode region 20 and the buried region 30 increases and accordingly the base resistance of the parasitic bipolar transistor will increase. On the other hand, with the semiconductor device 100 of this embodiment, by configuring the p-type high concentration region 140 as above, even when impurity ions are implanted such that the p-type high concentration region 140 is formed to be slightly deeper in relation to the surface of the semiconductor substrate 102, the p-type high concentration region 140 can be formed to be closer to the surface of the semiconductor substrate 102 below the element isolation insulating layer 134. Accordingly, the p-type high concentration region 140 can be formed at a deeper position below the gate insulating layer 136 in relation to the surface of the substrate while keeping the distance between the p-type high concentration region 140 and the back gate electrode 122 shorter. As a result, even when the p-type high concentration region 140 is formed below the gate insulating layer 136, it is possible to minimize the effect on the VT value of the MOS transistor and suppress the increase in the base resistance of the parasitic bipolar transistor.

In FIG. 2, white portions denote regions in which the element isolation insulating layers (the element isolation insulating layer 130, the element isolation insulating layer 132 and the element isolation insulating layer 134) are formed. In addition, for the purpose of description, the gate electrode 138 and the p-type high concentration region 140 are indicated by only lines.

In this embodiment, when seen in a plan view, the p-type high concentration region 140 may be configured to be formed over a range from at least one end, which is opposite to the other end facing to and contacting with the channel region 110a, of the n-type source-side diffusion region 114 to one end, which is facing to the channel region 110a, of the element isolation insulating layer 134. This configuration allows an increase in the ON breakdown voltage of the high breakdown voltage MOS transistor 142. In addition, a distance "A" between the p-type high concentration region 140 and the n-type drain-side diffusion region 112 may be set equal to or more than 0 μm so that the p-type high concentration region 140 does not extend up to the lower side of the element isolation insulating layer 132. Here, for the distance "A", a direction heading from the n-type drain-side diffusion region 112 toward the n-type source-side diffusion region 114 may be defined as + (plus) with an end, which is facing to the n-type source-side diffusion region 114, of the n-type drain-side diffusion region 112 as its origin. This allows a simultaneous increase in the ON and OFF breakdown voltages of the high breakdown voltage MOS transistor 142. By forming the p-type high concentration region 140, it is possible to reduce the base resistance of the base of the parasitic bipolar transistor and hence significantly improve the ON breakdown voltage of the high breakdown voltage MOS transistor 142. However, if the p-type high concentration region 140 is formed on the entire surface of the p-type low concentration region 110, the high breakdown voltage cannot be kept between the p-type low concentration region 110 and the n-type drain-side diffusion region 112, which results in lowering of the OFF breakdown voltage. In this embodiment, by setting the p-type high concentration region 140 in the appropriate place, it is possible to simultaneously keep the high ON and OFF breakdown voltages.

Next, procedures of manufacturing the semiconductor device 100 according to this embodiment will be described. FIGS. 3A and 3B and FIGS. 4A and 4B are process sectional views showing procedures of manufacturing the semiconductor device 100 according to this embodiment.

Figure 3A:
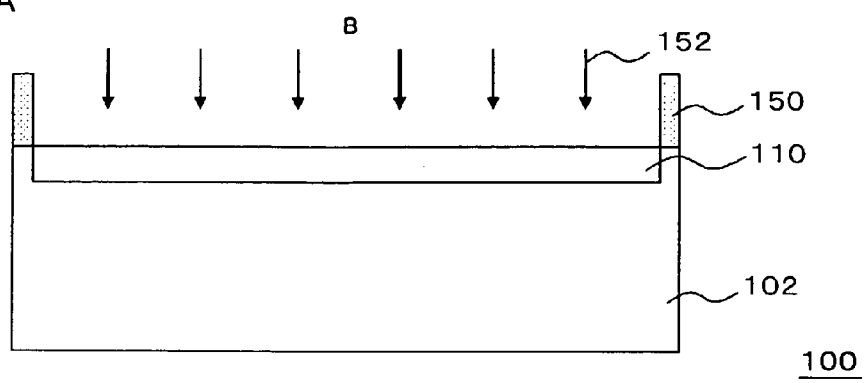
FIGS. 3A and 3B are sectional views showing procedures of manufacturing a semiconductor device according to an embodiment of the present invention.

First, a resist film 150 with a predetermined aperture pattern is formed over the semiconductor substrate 102, and p-type impurity ions 152 are implanted into the semiconductor substrate 102 using the resist film 150 as a mask. Here, the p-type impurity ions 152 may be boron (B) ions. Thus, the p-type low concentration region 110 is formed on the surface of the semiconductor substrate 102 (FIG. 3A).

Subsequently, the element isolation insulating layer 130, the element isolation insulating layer 132, the element isolation insulating layer 134 and an oxide layer 154 are formed on the surface of the semiconductor substrate 102. These element isolation insulating layers may be formed by Local Oxidation of Silicon (LOCOS). In addition, the element isolation insulating layer 134 can be formed to have a narrower width than the element isolation insulating layer 132 and the element isolation insulating layer 130. This allows a reduction in the distance between the channel region 110a and the source electrode 120, a decrease in ON resistance, and a reduction of element areas. This further allows a decrease of the base resistance of the parasitic bipolar transistor, which results in improvement of the ON breakdown voltage. In addition, the element isolation insulating layer 134 can be formed to have a thinner coating than the element isolation insulating layer 132 and the element isolation insulating layer 130. This allows a peak concentration portion with the highest impurity concentration to be formed at a deeper position in the n-type source-side diffusion region 114 than that of the n-type drain-side diffusion region 112 since impurity ions are more deeply implanted over the element isolation insulating layer 134 when the ions are implanted to form the n-type drain-side diffusion region 112 and the n-type source-side diffusion region 114 later. This allows a decrease in gate-source resistance and hence decreases the ON resistance.

Figure 3B:
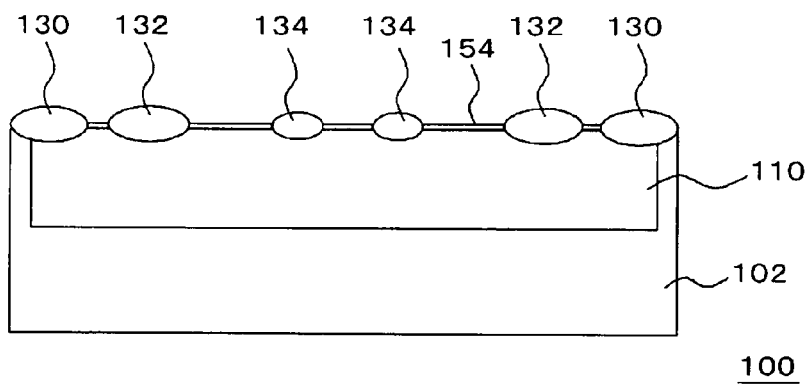

Subsequently, a high temperature burying process is performed (for example, for several hours at a temperature of 1200° C. or so) to diffuse the p-type low concentration region 110 (FIG. 3B).

Figure 4A:
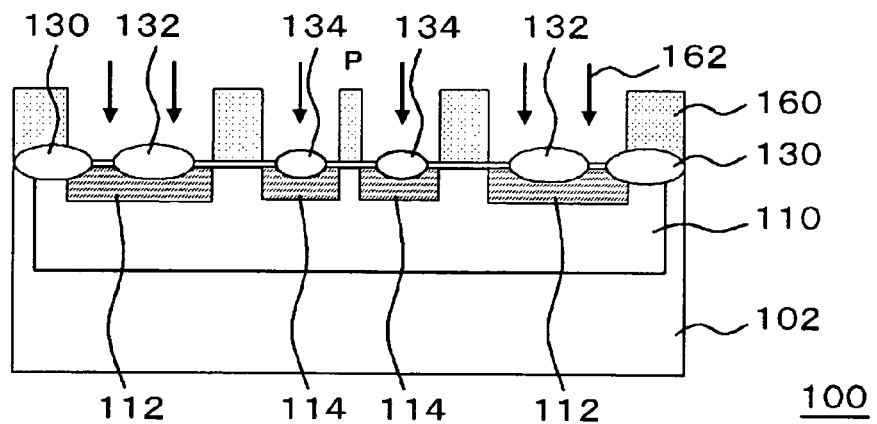
FIGS. 4A and 4B are sectional views showing procedures of manufacturing a semiconductor device according to an embodiment of the present invention.

Subsequently, a resist film 160 with a predetermined aperture pattern is formed over the semiconductor substrate 102, and n-type impurity ions 162 are implanted into the semiconductor substrate 102 using the resist film 160 as a mask. Here, the n-type impurity ions 162 may be phosphorus (P) ions. Thus, the n-type drain-side diffusion region 112 is formed under the element isolation insulating layer 132 and under the end, facing to the element isolation insulating layer 132, of the element isolation insulating layer 130, in the p-type low concentration region 110. At the same time, the n-type source-side diffusion region 114 is formed under the element isolation insulating layer 134 in the p-type low concentration region 110 (FIG. 4A). In this embodiment, the n-type source-side diffusion region 114 and the n-type drain-side diffusion region 112 can be formed by the same ion implantation process using the same resist film 160. This allows a reduction in the number of resists and hence simplification of the process.

Figure 4B:
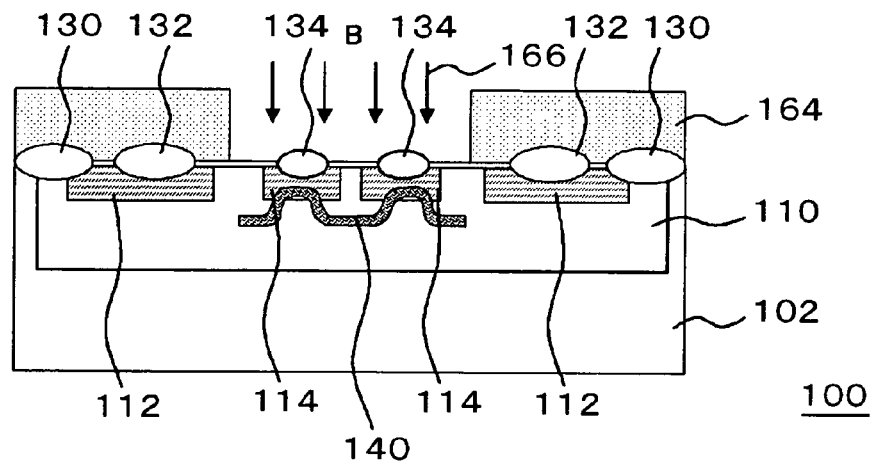

Thereafter, a resist film 164 with a predetermined aperture pattern is formed over the semiconductor substrate 102, and p-type impurity ions 166 are implanted into the semiconductor substrate 102 using the resist film 164 as a mask. Here, the p-type impurity ions 166 may be boron (B) ions. Thus, the p-type high concentration region 140 is formed under the n-type source-side diffusion region 114 (FIG. 4B). The p-type high concentration region 140 may be formed by implanting the impurity ions under the condition of several hundreds key or so. In this embodiment, the p-type high concentration region 140 is formed at a shallow position closer to the surface of the semiconductor substrate 102 below the element isolation insulating layer 134 than other regions such as the back gate electrode 122, the source electrode 120 and the gate insulating layer 136. Accordingly, below the gate insulating layer 136, the p-type high concentration region 140 can be formed at a deep position from the surface of the semiconductor substrate 102 while keeping the distance between the p-type high concentration region 140 and the back gate electrode 122 shorter. As a result, it is possible to minimize the effect on the VT value of the MOS transistor while suppressing the increase in the base resistance of the parasitic bipolar transistor.

Subsequently, the gate insulating layer 136 is formed over the semiconductor substrate 102. Here, the gate insulating layer 136 may be formed to have thickness of, for example, 50 nm to 200 nm. Subsequently, a conductive layer constituting the gate electrode 138 is formed over the gate insulating layer 136, and then the gate electrode 138 and the conductive layer are patterned into a gate shape. Thereafter, a side wall is formed on the side of the gate electrode 138.

Thereafter, n-type impurity ions are implanted into regions corresponding to the drain electrode 118 and the source electrode 120, and at the same time, p-type impurity ions are implanted into a region corresponding to the back gate electrode 122. Additionally, surfaces of these regions are silicided to form the drain electrode 118, the source electrode 120 and the back gate electrode 122. In this embodiment, the source electrode 120 and the back gate electrode 122 may be configured to be circuit-shorted over the diffusion layer.

With this configuration, by implanting the p-type high concentration region 140 with the impurity ions, the base resistance of the base of the parasitic bipolar transistor can be decreased, which results in significant improvement in the ON breakdown voltage of the high breakdown voltage MOS transistor 142. However, if the p-type high concentration region 140 is formed on the entire surface of the p-type low concentration region 110, the high breakdown voltage cannot be kept between the p-type low concentration region 110 and the n-type drain-side diffusion region 112, which results in lowering of the OFF breakdown voltage. In this embodiment, by forming the p-type high concentration region 140 in the appropriate place as described in the above, it is possible to simultaneously keep the high ON and OFF breakdown voltages.

In this embodiment, further, since the n-type drain-side diffusion region 112 and the n-type source-side diffusion region 114 can be formed by the same process, it is possible to reduce dimension variations of a gate length L of the channel region 110a. In the case where the n-type drain-side diffusion region 112 and the n-type source-side diffusion region 114 are simultaneously formed by the same process, if the concentration of impurity ions is increased, the breakdown voltage of the n-type drain-side diffusion region 112 decreases. Accordingly, the concentration of impurity ions should not be too high. On the other hand, if the concentration of impurity ions of the n-type source-side diffusion region 114 is too low, the ON resistance increases. In this embodiment, by forming the p-type high concentration region 140 in the appropriate place, since the base resistance of the base of the parasitic bipolar transistor can be decreased, it is possible to simultaneously keep the high ON and OFF breakdown voltages even when the n-type drain-side diffusion region 112 and the n-type source-side diffusion region 114 are simultaneously formed.

Second Embodiment

Figure 5:
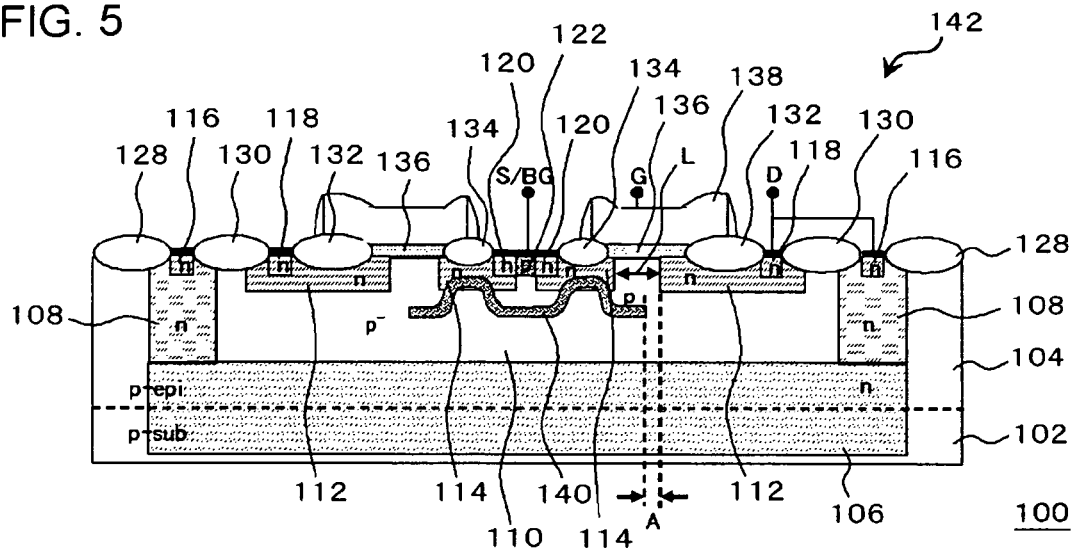
FIG. 5 is a sectional view showing a configuration of a semiconductor device according to an embodiment of the present invention.
Figure 6:
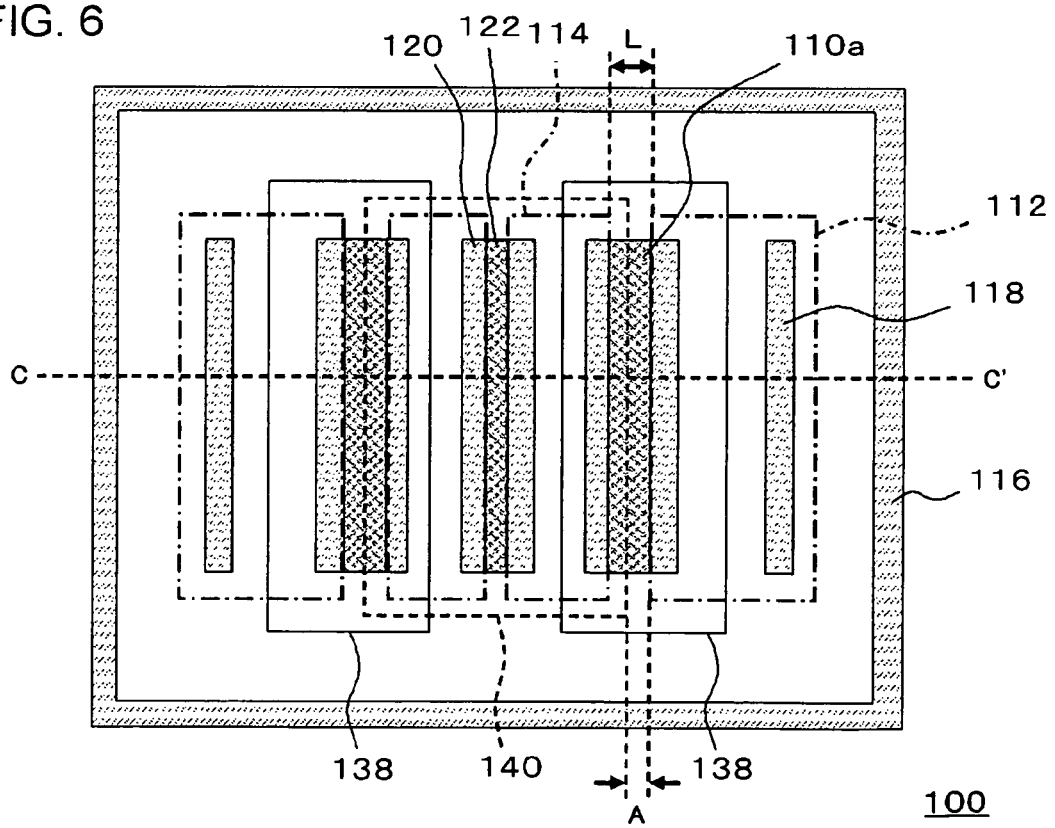
FIG. 6 is a plan view showing a configuration of the semiconductor device according to an embodiment of the present invention.

FIG. 5 is a sectional view showing a configuration of a semiconductor device according to this embodiment. FIG. 6 is a plan view showing a configuration of the semiconductor device shown in FIG. 5. FIG. 5 corresponds to a sectional view taken along line C-C' of FIG. 6.

In this embodiment, a substrate of the semiconductor device 100 may be configured such that a semiconductor layer 104 is formed over the semiconductor substrate 102 which is a semiconductor wafer. The semiconductor substrate 102 may be, for example, a p-type silicon substrate (silicon wafer). The semiconductor layer 104 may be, for example, a p-type silicon epitaxial layer. In addition, an n-type buried region 106 and an n-type sinker region 108 are formed in the semiconductor substrate 102 and the semiconductor layer 104 of the semiconductor device 100. Here, the n-type sinker region 108 is continuously formed on the n-type buried region 106 over a range from the n-type buried region 106 to a surface of the semiconductor layer 104. In this embodiment, the p-type low concentration region 110 is formed in a region surrounded by the n-type buried region 106 and the n-type sinker region 108 in the semiconductor layer 104. Impurity ion concentration of the n-type buried region 106 and the n-type sinker region 108 may be $1 \times 10^{19}$ to $1 \times 10^{20}$ cm$^{-3}$. By providing the n-type buried region 106 and the n-type sinker region 108, a predetermined potential can be set for the back gate electrode 122. With this configuration, accordingly, as the semiconductor device 100 of this embodiment, an NMOS can be used in a power source side (high side) within a circuit, instead of a PMOS with relatively low current capability.

The n-type drain-side diffusion region 112 and the n-type sinker region 108 are isolated from each other by the element isolation insulating layer 130. A drain electrode 116 is formed on a surface of the n-type sinker region 108. The drain electrode 116 is electrically connected to the drain electrode 118, and the drain electrode is constituted by the drain electrode 116 and the drain electrode 118. In addition, an element isolation insulating layer 128 is formed at the outer side of the drain electrode 116.

In this embodiment, the p-type high concentration region 140 is formed in the same place as in the first embodiment.

Next, procedures of manufacturing the semiconductor device 100 according to this embodiment will be described. FIGS. 7A to 9B are process sectional views showing procedures of manufacturing the semiconductor device 100 according to this embodiment.

Figure 7A:
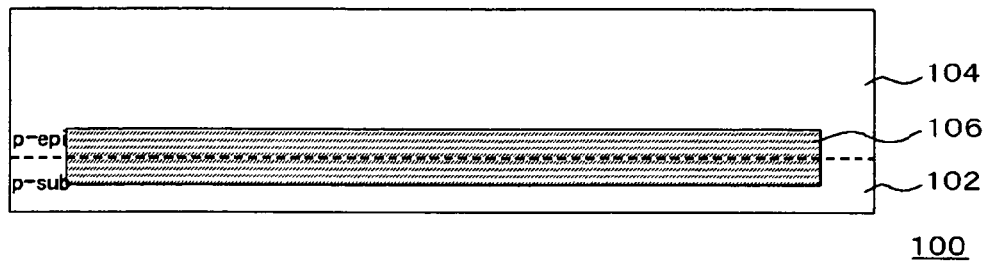
FIGS. 7A to 7C are sectional views showing procedures of manufacturing a semiconductor device according to an embodiment of the present invention.
Figure 7B:
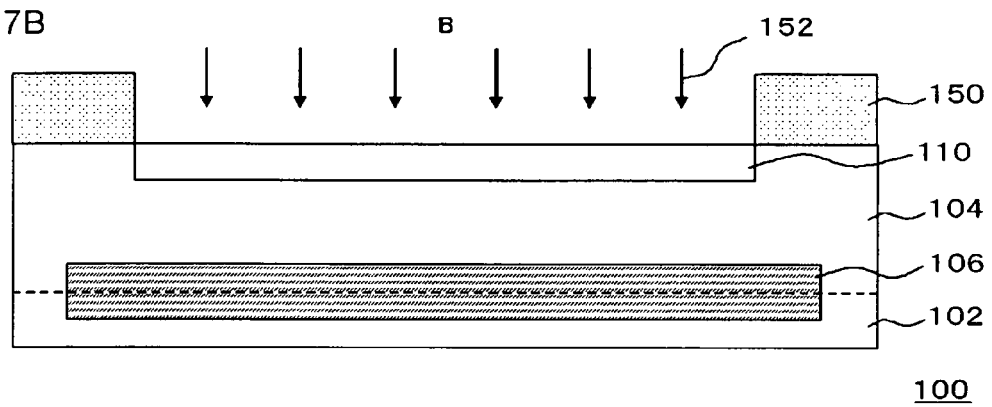

First, the n-type buried region 106 is formed on the surface of the semiconductor substrate 102, and then the semiconductor layer 104 is formed over the semiconductor substrate 102 by epitaxial growth. Thus, the n-type buried region 106 is also expanded into the semiconductor layer 104 (FIG. 7A). Subsequently, the resist film 150 with the predetermined aperture pattern is formed over the semiconductor layer 104, and the p-type impurity ions 152 are implanted into the semiconductor layer 104 using the resist film 150 as a mask. Here, the p-type impurity ions 152 may be boron (B) ions. Thus, the p-type low concentration region 110 is formed on the surface of the semiconductor layer 104 (FIG. 7B).

Subsequently, the element isolation insulating layer 128, the element isolation insulating layer 130, the element isolation insulating layer 132, the element isolation insulating layer 134 and the oxide layer 154 are formed on the surface of the semiconductor layer 104. These element isolation insulating layers may be formed by Local Oxidation of Silicon (LOCOS). In addition, in this embodiment, as same as the first embodiment, the element isolation insulating layer 134 can be formed to have a thinner coating and narrower width than the element isolation insulating layer 132 and the element isolation insulating layer 130.

Figure 7C:
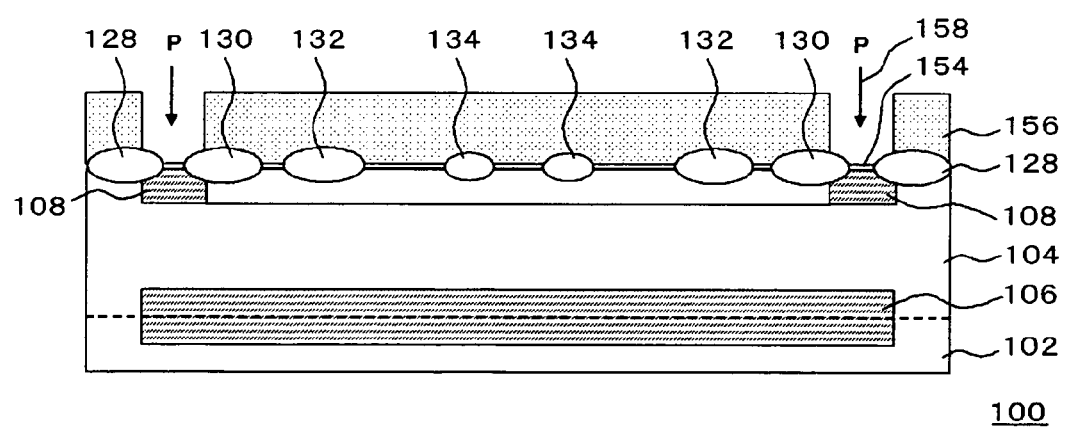

Thereafter, a resist film 156 with a predetermined aperture pattern is formed over the semiconductor layer 104, and n-type impurity ions 158 are implanted into the semiconductor layer 104 using the resist film 156 as a mask. Here, the n-type impurity ions 158 may be phosphorus (P) ions. Thus, the n-type sinker region 108 is formed (FIG. 7C).

Figure 8A:
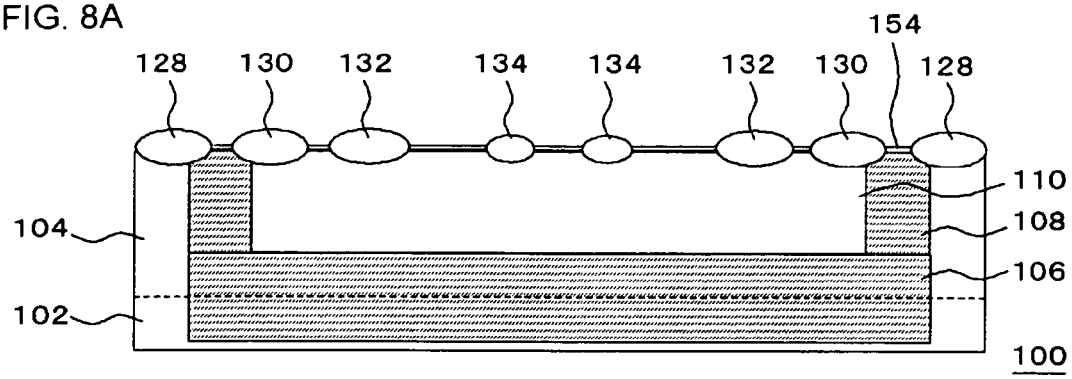
FIGS. 8A and 8B are sectional views showing procedures of manufacturing a semiconductor device according to an embodiment of the present invention.
Figure 8B:
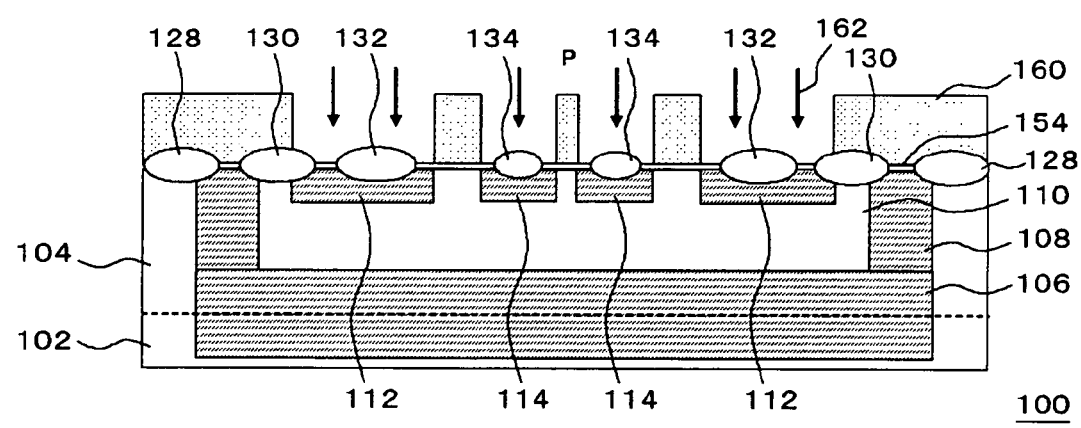

Subsequently, a high temperature burying process is performed (for example, for several hours at a temperature of 1200° C. or so) to diffuse the n-type buried region 106, the n-type sinker region 108 and the p-type low concentration region 110. Thus, the n-type buried region 106, and the n-type sinker region 108 are continuously formed around the p-type low concentration region 110 (FIG. 8A).

Subsequently, the resist film 160 with the predetermined aperture pattern is formed over the semiconductor layer 104, and the n-type impurity ions 162 are implanted into the semiconductor layer 104 using the resist film 160 as a mask. Here, the n-type impurity ions 162 may be phosphorus (P) ions. Thus, the n-type drain-side diffusion region 112 is formed under the element isolation insulating layer 132 and under the end, facing to the element isolation insulating layer 132, of the element isolation insulating layer 130, in the p-type low concentration region 110. At the same time, the n-type source-side diffusion region 114 is formed under the element isolation insulating layer 134 in the p-type low concentration region 110.

Figure 9A:
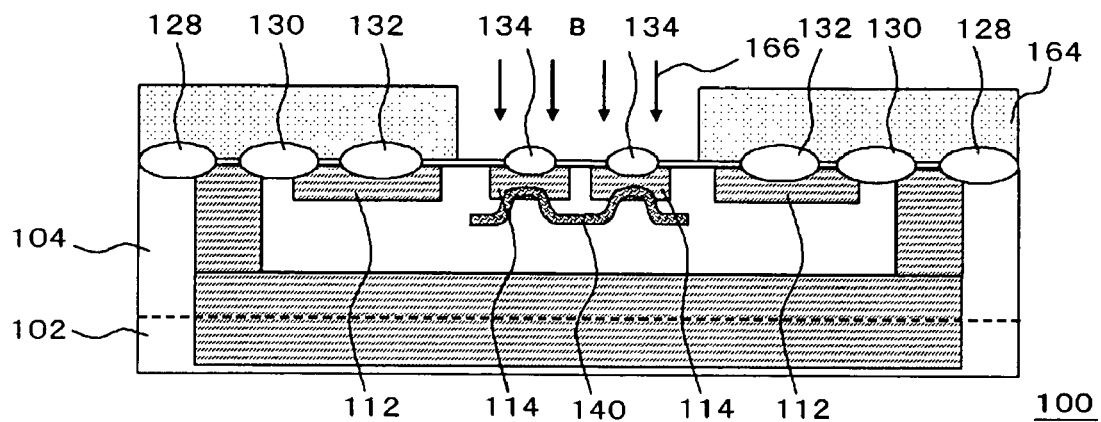
FIGS. 9A and 9B are sectional views showing procedures of manufacturing a semiconductor device according to an embodiment of the present invention.

Thereafter, the resist film 164 with the predetermined aperture pattern is formed over the semiconductor layer 104, and the p-type impurity ions 166 are implanted into the semiconductor layer 104 using the resist film 164 as a mask. Here, the p-type impurity ions 166 may be boron (B) ions. Thus, the p-type high concentration region 140 is formed under the n-type source-side diffusion region 114 (FIG. 9A).

Figure 9B:
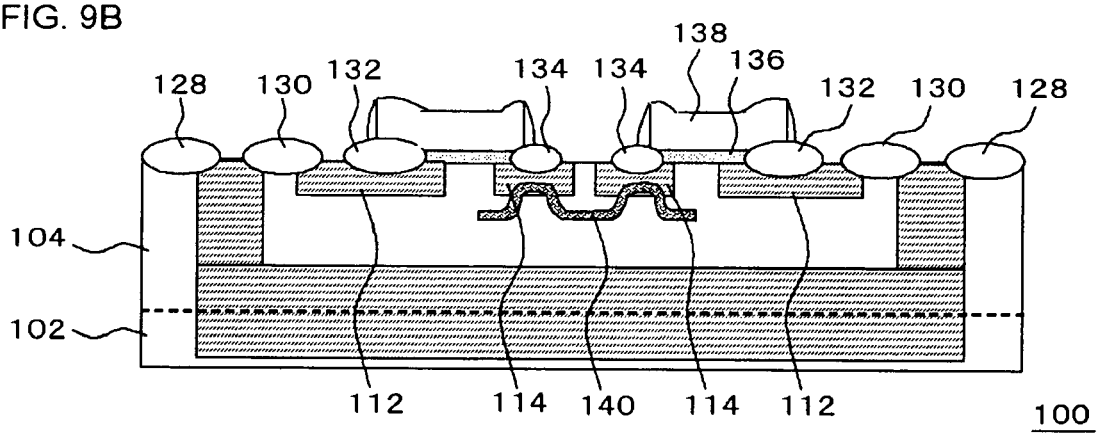

Subsequently, the gate insulating layer 136 is formed over the semiconductor layer 104. Here, the gate insulating layer 136 may be formed to have thickness of, for example, 50 nm to 200 nm. Subsequently, a conductive layer constituting the gate electrode 138 is formed over the gate insulating layer 136, and then the gate electrode 138 and the conductive layer are patterned into a gate shape. Thereafter, a side wall is formed on the side of the gate electrode 138 (FIG. 9B).

Thereafter, by forming the drain electrode 118, the source electrode 120 and the back gate electrode 122, the semiconductor device 100 with the configuration shown in FIG. 5 can be obtained.

This embodiment can obtain the same effect as the first embodiment. In addition, in this embodiment, a punch-through effect between the n-type source-side diffusion region 114 and the n-type buried region 106 can be prevented by providing the p-type high concentration region 140 under the n-type source-side diffusion region 114. As described above, in this embodiment, since the impurity concentration of the p-type low concentration region 110 is low, a punch-through effect between the n-type source-side diffusion region 114 and the n-type buried region 106 is likely to occur. Even in this case, the punch-through effect can be prevented by providing the p-type high concentration region 140.
(Simulation Results)

EXAMPLE 1

Figure 10:
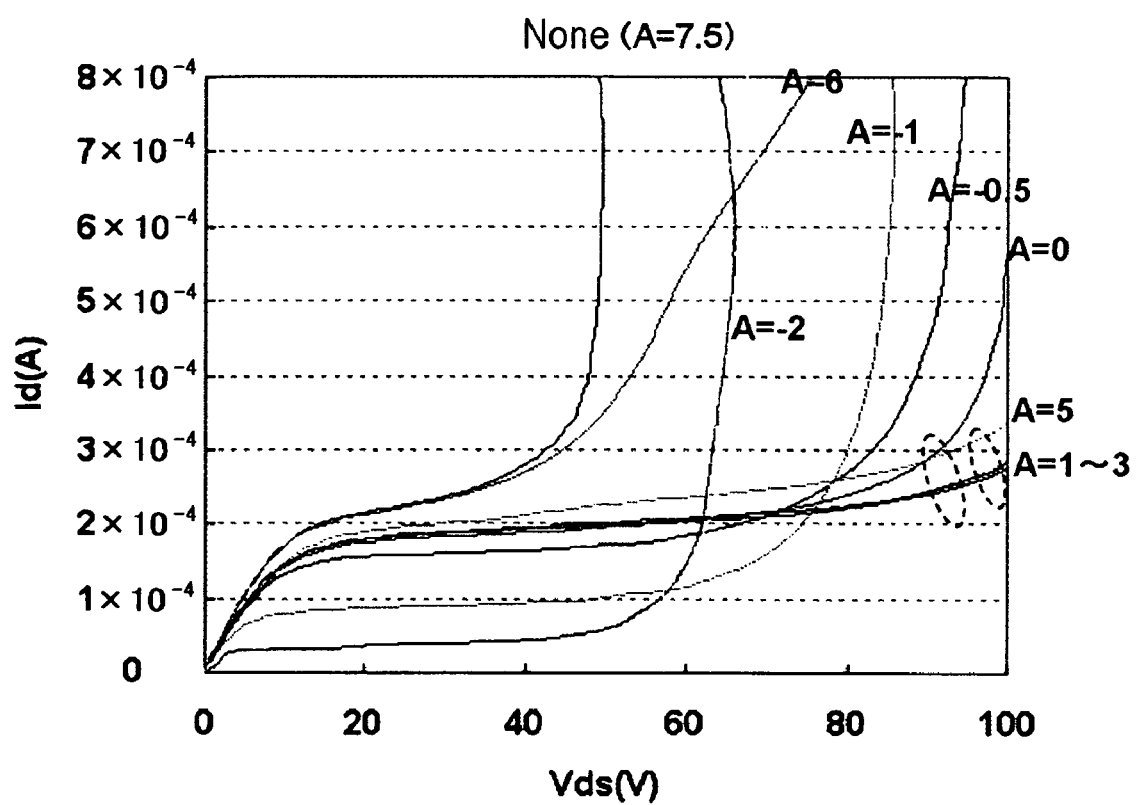
FIG. 10 is a view showing a simulation result for the semiconductor device with the configuration as described in the embodiment of the present invention.

FIG. 10 is a view showing a simulation result for the relationship between a drain current ($I_d$) and a drain-source voltage ($V_{ds}$) upon changing the distance "A" between the p-type high concentration region 140 and the n-type drain-side diffusion region 112 when seen in a plan view in the semiconductor device 100 with the configuration as described in the second embodiment. Here, the ON breakdown voltage corresponds to a drain-source voltage ($V_{ds}$) at which the drain current ($I_d$) begins to suddenly increase.

It is assumed in this example that a gate voltage Vg is 28V and a gate length L of the channel region 110a (the distance between the n-type drain-side diffusion region 112 and the n-type source-side diffusion region 114) is 4.5 μm. In addition, it is assumed here that the distance between the element isolation insulating layer 134 and the n-type drain-side diffusion region 112 is 5 μm when seen in a plan view. The p-type high concentration region 140 is formed by being doped with boron (B) such that its peak portion has concentration of about $1 \times 10^{18}$ cm$^{-3}$.

"None" stated in the figure corresponds to a result in the case where p-type high concentration region 140 is not provided. Here, the unit of A is μm. In the case where no p-type high concentration region 140 is provided, an ON breakdown voltage is about 45 V. On the other hand, the ON breakdown voltage can be increased by providing the p-type high concentration region 140. For example, when the distance "A" between the p-type high concentration region 140 and the n-type drain-side diffusion region 112 is equal to or more than 0 μm and equal to or less than 5 μm, the ON breakdown voltage increases to 90 V or more.

On the other hand, if the distance "A" between the p-type high concentration region 140 and the n-type drain-side diffusion region 112 exceeds 5 μm, the ON breakdown voltage decreases, and the effect of improvement in the ON breakdown voltage caused by providing the p-type high concentration region 140 is reduced. Such reduction in the effect of improvement in the ON breakdown voltage is because if the distance "A" exceeds 5 μm, the p-type high concentration region 140 is not present at a location near the n-type source-side diffusion region 114 close to the n-type drain-side diffusion region 112 and the p-type high concentration region 140 is also not present on a path of holes when the NPN bipolar transistor is turned on.

Further, if the distance "A" between the p-type high concentration region 140 and the n-type drain-side diffusion region 112 is less than 0 μm, that is, if the p-type high concentration region 140 extends to the lower side of the n-type drain-side diffusion region 112, the OFF breakdown voltage itself decreases and the ON breakdown voltage decreases accordingly. As can be seen from the above description, in order to increase the ON breakdown voltage, the p-type high concentration region 140 can be formed over a range from at least one end, which is opposite to the other end facing to and contacting with the channel region 110a, of the n-type source-side diffusion region 114 to one end, which is facing to the channel region 110a, of the element isolation insulating layer 134 when seen in a plan view.

EXAMPLE 2

Figure 11:
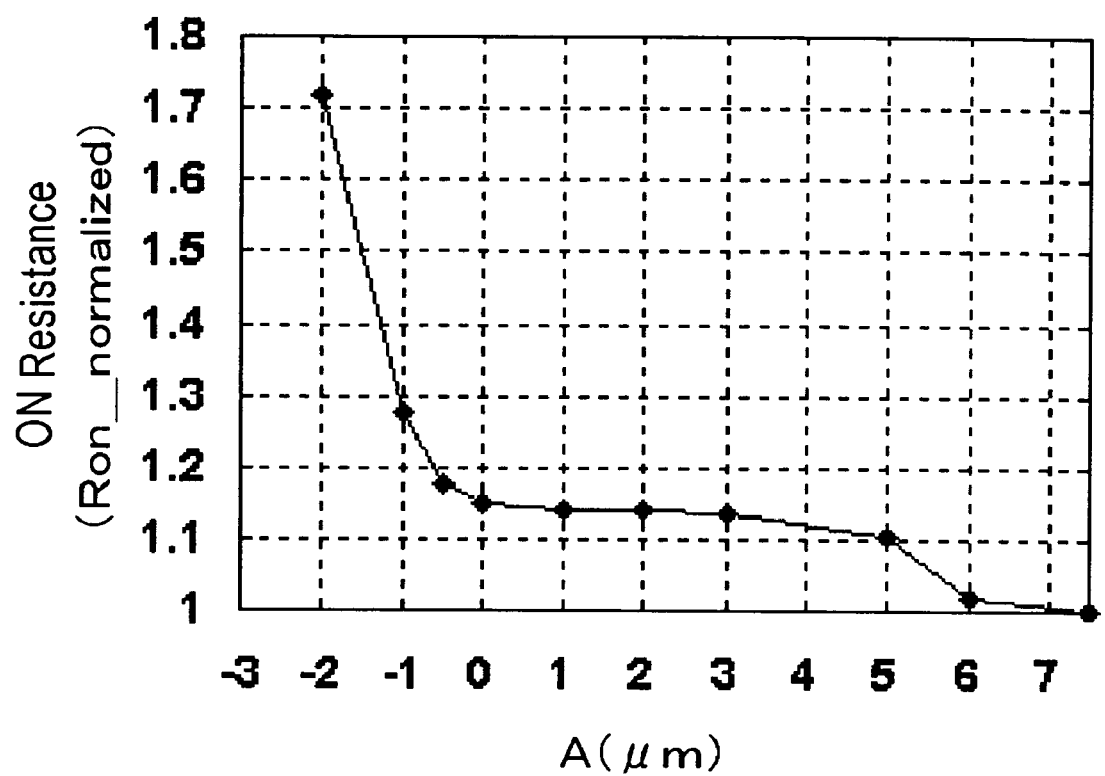
FIG. 11 is a view showing a simulation result for the semiconductor device with the configuration as described in the embodiment of the present invention.

FIG. 11 is a view showing a simulation result for ON resistance (standard value) upon changing the distance "A" (μm) between the p-type high concentration region 140 and the n-type drain-side diffusion region 112 when seen in a plan view in the semiconductor device 100 with the configuration as described in Example 1. Here, a drain-source voltage ($V_{ds}$) is 0.1 V and a gate-source voltage ($V_{gs}$) is 12 V.

Here, the ON resistance of A=7.5 μm is shown for the case when p-type high concentration region 140 is not provided. When the p-type high concentration region 140 is provided and A is equal to or less than 5 μm, the ON resistance increases as compared to the case where p-type high concentration region 140 is not provided. This is because the n-type source-side diffusion region 114 is cancelled out by the p-type high concentration region 140 due to the provision of the p-type high concentration region 140 under the n-type source-side diffusion region 114. However, if A is equal to or more than 0, the increase in the ON resistance is suppressed to 15% or so, which has only a little effect on device characteristics. On the other hand, if the distance "A" between the p-type high concentration region 140 and the n-type drain-side diffusion region 112 is less than 0 μm, that is, if the p-type high concentration region 140 extends to the lower side of the n-type drain-side diffusion region 112, the ON resistance significantly increases.

EXAMPLE 3

Figure 12:
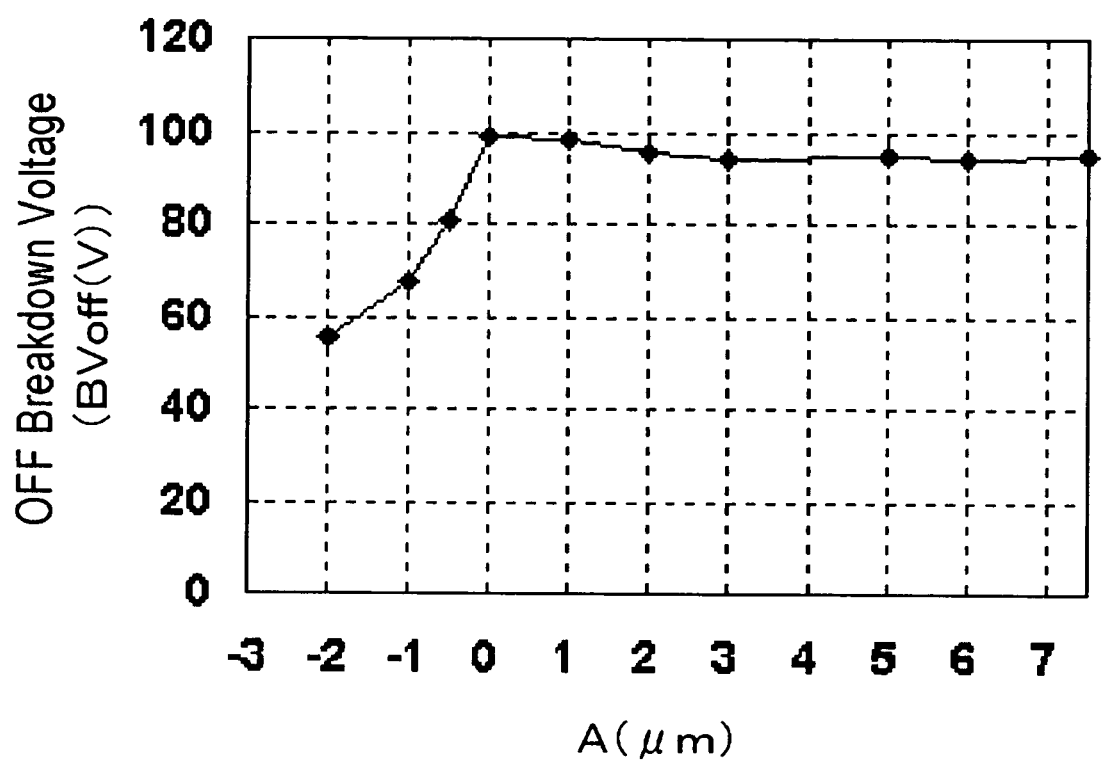
FIG. 12 is a view showing a simulation result for the semiconductor device with the configuration as described in the embodiment of the present invention.

FIG. 12 is a view showing a simulation result for an OFF breakdown voltage upon changing the distance "A" (μm) between the p-type high concentration region 140 and the n-type drain-side diffusion region 112 when seen in a plan view in the semiconductor device 100 with the configuration as described in Example 1. Here, a gate-source voltage ($V_{gs}$) is 0 V.

Here, the ON resistance of A=7.5 μm is shown for the case when p-type high concentration region 140 is not provided. When the p-type high concentration region 140 is provided and the distance "A" between the p-type high concentration region 140 and the n-type drain-side diffusion region 112 is less than 0 μm, that is, if the p-type high concentration region 140 extends to the lower side of the n-type drain-side diffusion region 112, the OFF breakdown voltage significantly decreases. On the other hand, even when the p-type high concentration region 140 is provided, as long as A is equal to or more than 0 μm, the high OFF breakdown voltage can be kept similar to the case where the p-type high concentration region 140 is not provided. Accordingly, the high ON and OFF breakdown voltages can be simultaneously kept by preventing the p-type high concentration region 140 from extending to the lower side of the n-type drain-side diffusion region 112.

EXAMPLE 4

As a simulation result for a threshold voltage (VT) of the high breakdown voltage MOS transistor 142 upon changing the distance "A" (μm) between the p-type high concentration region 140 and the n-type drain-side diffusion region 112 when seen in a plan view in the semiconductor device 100 with the configuration as described in Example 1, the threshold voltage increases with a decrease in the distance "A". This is because p-type impurity concentration of the p-type low concentration region 110 increases when a tail portion of the p-type high concentration region 140 reaches a surface of the p-type low concentration region 110 of the substrate. From this standpoint, it is preferable for the distance "A" to be large, for example, the distance "A" is equal to or more than 3 μm, more preferably 5 μm.

Although the exemplary embodiments of the present invention have been described in the above with reference to the drawings, these embodiments are only illustrative but the present invention may employ many other configurations.

For example, the p-type low concentration region 110 of the semiconductor device 100 with the configuration shown in the first embodiment may be configured by forming a p-type epitaxial layer with the same concentration as the p-type low concentration region 110 over the semiconductor substrate 102. Furthermore, a semiconductor substrate 102 with the same concentration as the p-type low concentration region 110 may be prepared and the prepared semiconductor substrate 102 may be used as the p-type low concentration region 110.

The high breakdown voltage MOS transistor 142 in each of the above embodiments may be formed in combination with, for example, a typical LDMOS with a drain high breakdown voltage and a gate low breakdown voltage or a MOS with a drain high breakdown voltage and a gate high breakdown voltage. In addition, for example, in the case of LDMOS, the thickness of a gate insulating layer is smaller than that of the gate insulating layer 136 of the high breakdown voltage MOS transistor 142 in the above embodiments. In this manner, if there is a need to form a plurality of gate insulating layers with different thicknesses, it is possible to remove by etching a gate insulating layer with a larger thickness so as to form a gate insulating layer with a smaller thickness using a multi-oxide process.

Although it has been illustrated in the above embodiments that the first conductivity is the p-type and the second conductivity is the n-type, the conductivity may be reversed.

Figure 15:
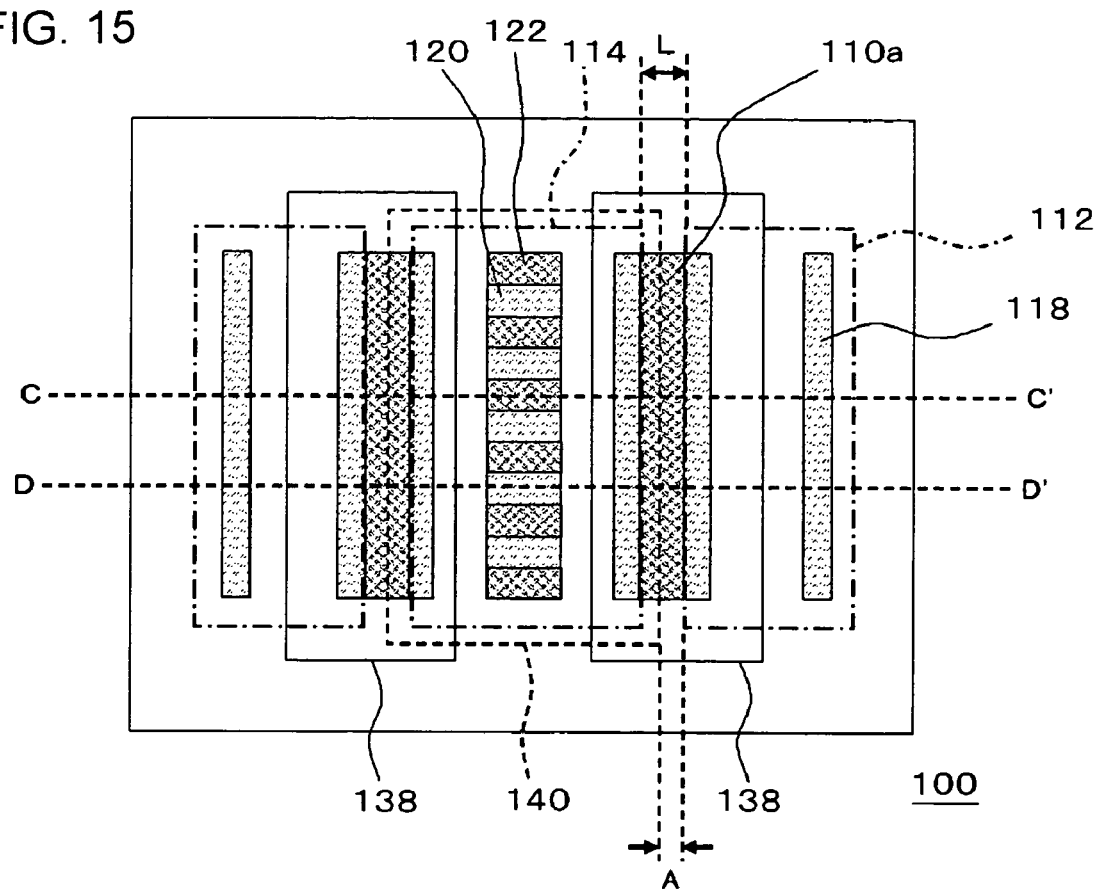
FIG. 15 is a plan view showing another exemplary configuration of the semiconductor device according to an embodiment of the present invention.
Figure 16:
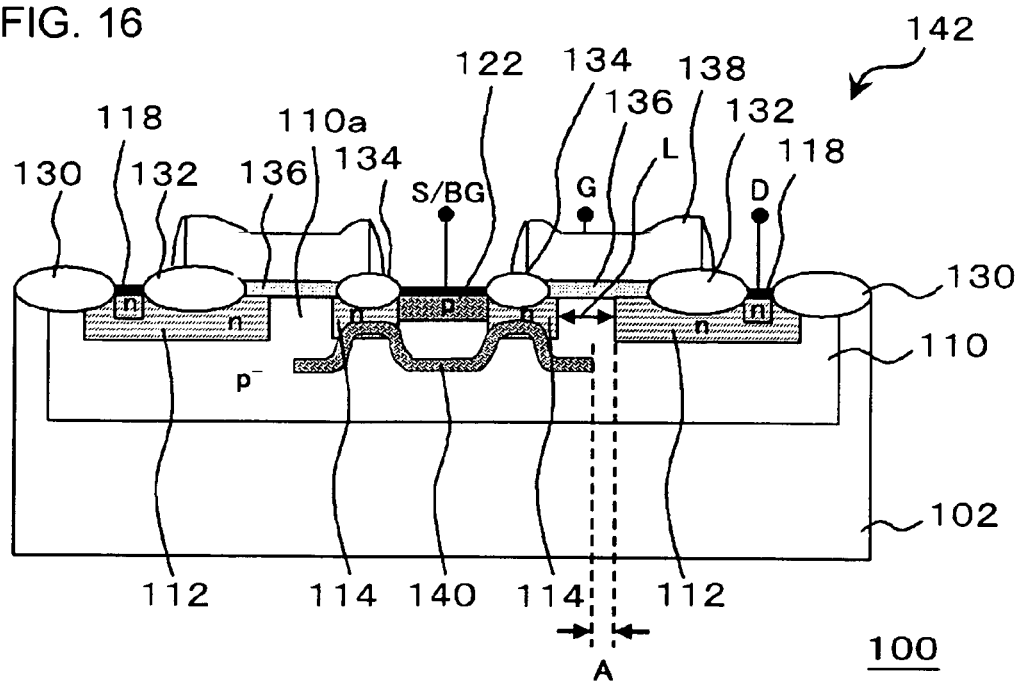
FIG. 16 is a sectional view taken along line C-C' of FIG. 15.
Figure 17:
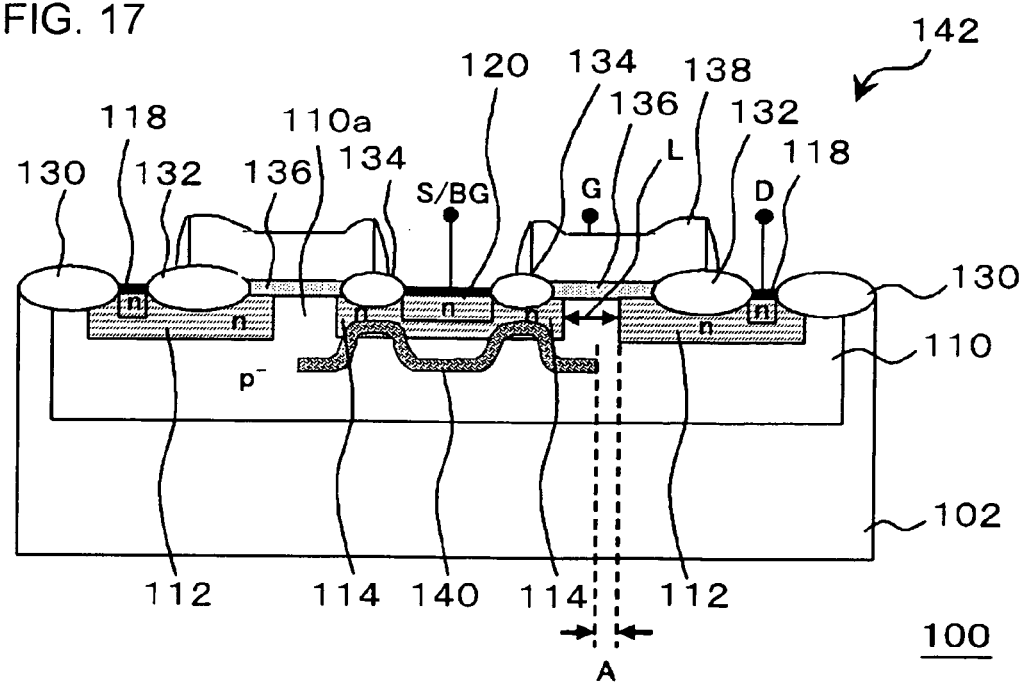
FIG. 17 is a sectional view taken along line D-D' of FIG. 15.

In addition, in the semiconductor device 100, as disclosed in Japanese Laid-open patent publication NO. Hei-11-307763, the source electrode 120 and the back gate electrode 122 may be configured so as to alternate along the extension direction of the gate electrode 138, as shown in FIG. 15. FIG. 15 is a plan view of the semiconductor device 100, FIG. 16 is a sectional view taken along line C-C' of FIG. 15, and FIG. 17 is a sectional view taken along line D-D' of FIG. 15. As shown in FIG. 16, also in the semiconductor device 100 with such a configuration, the p-type high concentration region 140 may be formed at a deeper position in relation to the surface of the substrate under the gate insulating layer 136 while reducing the distance between the p-type high concentration region 140 and the back gate electrode 122. Accordingly, even when the p-type high concentration region 140 is formed under gate insulating layer 136, it is possible to suppress the increase in the base resistance of the parasitic bipolar transistor while minimizing the effect on the VT value of the MOS transistor.

In addition, although it has been illustrated in the above embodiments that the p-type high concentration region 140 is formed by implanting impurity ions over the element isolation insulating layer 134 after forming the element isolation insulating layer 134, the p-type high concentration region 140 may be formed before forming the element isolation insulating layer 134. In this case, the p-type high concentration region 140 may be configured so as to be formed at the same depth over the entire surface. Even with this configuration, for example if the p-type high concentration region 140 does not extend to below the gate insulating layer 136, the effect on the variation of the VT value of the MOS transistor can be suppressed without causing any problems.

It is apparent that the present invention is not limited to the above embodiments, and may be modified and changed without departing from the scope and spirit of the invention.

What is claimed is:

1. A semiconductor device, comprising:
   a substrate; and
   a field effect transistor, wherein said field effect transistor includes:
      a channel region with a gate length "L" formed at a surface of said substrate;
      a gate electrode formed over said channel region;
      a source electrode and a drain electrode formed at both sides of said gate electrode;
      a low concentration region of a first conductivity type, which is formed in the surface of said substrate, said low concentration region being formed within said channel region;
      a drain-side diffusion region of a second conductivity type, which is formed in a surface of said low concentration region of said first conductivity type, said drain electrode being formed over a portion of a surface of said drain-side diffusion region;
      a source-side diffusion region of said second conductivity type, which is formed in a surface of said low concentration region of said first conductivity type, said channel region being formed between said drain-side diffusion region and said source-side diffusion region, said source electrode being formed over a portion of a surface of said source-side diffusion region;
      a first element isolation insulating layer which is formed over said drain-side diffusion region of said second conductivity type, isolates said drain-side diffusion region at the surface of said substrate and isolates said channel region from said drain electrode;
      a second element isolation insulating layer which is formed over said source-side diffusion region of said second conductivity type, isolates said source-side diffusion region at the surface of said substrate and isolates said channel region from said source electrode; and
      a high concentration region of said first conductivity type, which has an impurity concentration higher than the impurity concentration of said low concentration region, formed below said source-side diffusion region in said low concentration region of said first conductivity type over a range at least from a first end of said source-side diffusion region, said first end being distal from said channel region, to an end of said second element isolation insulating layer, said end being proximate to said channel region.

2. The semiconductor device as set forth in claim 1, wherein a distance "A" between said high concentration region of said first conductivity type and said drain-side diffusion region is equal to or more than 0 μm when seen in a plan view.

3. The semiconductor device as set forth in claim 1, wherein said high concentration region of said first conductivity type is formed at least across the entire region under said source-side diffusion region.

4. The semiconductor device as set forth in claim 1, wherein said drain-side diffusion region and said source-side diffusion region are formed by using the same ion implantation process.

5. The semiconductor device as set forth in claim 1, wherein a buried region of said second conductivity type and a sinker region of said second conductivity type, which is continuously provided from said buried region to the surface of said substrate, are further formed in said substrate, and said low concentration region of said first conductivity type is surrounded by said buried region and said sinker region.

6. The semiconductor device as set forth in claim 1, wherein said first element isolation insulating layer is formed to be thicker than said second element isolation insulating layer, and a peak concentration portion having the highest impurity concentration of said second conductivity type is formed at a deeper position in said source-side diffusion region than that of said drain-side diffusion region.

7. The semiconductor device as set forth in claim 6, wherein said first element isolation insulating layer is formed to be wider width than said second element isolation insulating layer.

8. The semiconductor device according to claim 1, wherein a clearance exists between said high concentration region and said drain side diffusion region.

9. The semiconductor device according to claim 1, wherein said high concentration region is formed underneath said second element isolation insulating layer.

10. The semiconductor device according to claim 1, wherein said high concentration region extends underneath an entirety of said second element isolation insulating layer.

11. The semiconductor device according to claim 1, wherein said field effect transistor is devoid of a high concentration region beneath said drain-side diffusion region.

12. The semiconductor device as set forth in claim 1, wherein said high concentration region extends into said channel region.

13. The semiconductor device as set forth in claim 12, wherein said high concentration region extends across less than an entirety of said channel region.

14. The semiconductor device according to claim 1, further comprising a back gate electrode disposed adjacent the source electrode.

15. The semiconductor device according to claim 14, wherein said back gate electrode and said source electrode are short circuited over said source-side diffusion layer.

16. The semiconductor device according to claim 14, wherein said high concentration region extends underneath said back gate electrode.

17. A semiconductor device, comprising:
a substrate; and
a field effect transistor, wherein said field effect transistor includes:
  a channel region with a gate length "L" formed at a surface of said substrate;
  a gate electrode formed over said channel region;
  a source electrode and a drain electrode formed at both sides of said gate electrode;
  a low concentration region of a first conductivity type, which is formed in the surface of said substrate;
  a drain-side diffusion region of a second conductivity type, which is formed in a surface of said low concentration region of said first conductivity type, said drain electrode being formed over a portion of a surface of said drain-side diffusion region;
  a source-side diffusion region of said second conductivity type, which is formed in a surface of said low concentration region of said first conductivity type, said channel region being formed between said drain-side diffusion region and said source-side diffusion region, said source electrode being formed over a portion of a surface of said source-side diffusion region;
  a first element isolation insulating layer which is formed over said drain-side diffusion region of said second conductivity type, isolates said drain-side diffusion region at the surface of said substrate and isolates said channel region from said drain electrode;
  a second element isolation insulating layer which is formed over said source-side diffusion region of said second conductivity type, isolates said source-side diffusion region at the surface of said substrate and isolates said channel region from said source electrode; and
  a high concentration region of said first conductivity type, which has an impurity concentration higher than the impurity concentration of said low concentration region, formed below said source-side diffusion region in said low concentration region of said first conductivity type over a range at least from a first end of said source-side diffusion region, said first end being distal from said channel region, to an end of said second element isolation insulating layer, said end being proximate to said channel region,
wherein said high concentration region of said first conductivity type is formed at a shallow position closer to the surface of said substrate below said second element isolation insulating layer than other regions.

* * * * *